US010629696B1

(12) United States Patent
Park et al.

(10) Patent No.: US 10,629,696 B1
(45) Date of Patent: Apr. 21, 2020

(54) METHOD FOR FORMING HEXAGONAL BORON NITRIDE THIN FILM, METHOD FOR FORMING MULTI-LAYERED STRUCTURE AND METHOD FOR MANUFACTURING SWITCHING ELEMENT USING THE SAME

(71) Applicant: KOREA INSTITUTE OF SCIENCE AND TECHNOLOGY, Seoul (KR)

(72) Inventors: Jaehyun Park, Seoul (KR); Yumin Sim, Seoul (KR); Jaikyeong Kim, Seoul (KR)

(73) Assignee: Korea Institute of Science and Technology, Seoul (KR)

(*) Notice: Subject to any disclaimer, the term of this patent is extended or adjusted under 35 U.S.C. 154(b) by 0 days.

(21) Appl. No.: 16/201,293

(22) Filed: Nov. 27, 2018

(30) Foreign Application Priority Data

Nov. 6, 2018 (KR) ........................ 10-2018-0134962

(51) Int. Cl.

| | |
|---|---|
| ***H01L 29/66*** | (2006.01) |
| ***H01L 29/49*** | (2006.01) |
| ***H01L 29/51*** | (2006.01) |
| ***H01L 21/02*** | (2006.01) |

(Continued)

(52) U.S. Cl.

CPC .... *H01L 29/66045* (2013.01); *H01L 21/0262* (2013.01); *H01L 21/02112* (2013.01); *H01L 21/02178* (2013.01); *H01L 21/02271* (2013.01); *H01L 21/02488* (2013.01); *H01L 21/02502* (2013.01); *H01L 21/02527* (2013.01); *H01L 29/1606* (2013.01); *H01L 29/4908* (2013.01); *H01L 29/513* (2013.01); *H01L 29/518* (2013.01); *H01L 29/66969* (2013.01); *H01L 21/0228* (2013.01); *H01L 21/02485* (2013.01); *H01L 29/24* (2013.01)

(58) Field of Classification Search

CPC ............. H01L 29/513; H01L 21/02488; H01L 29/518; H01L 21/02502; H01L 21/02112; H01L 21/02178

See application file for complete search history.

(56) References Cited

U.S. PATENT DOCUMENTS

| | | | | |
|---|---|---|---|---|
| 2014/0077266 | A1* | 3/2014 | Ramdani | H01L 29/513 257/194 |
| 2018/0076291 | A1* | 3/2018 | Koyama | H01L 29/2003 |

FOREIGN PATENT DOCUMENTS

| | | |
|---|---|---|
| KR | 10-1513136 B1 | 4/2015 |
| KR | 10-2016-0036012 A | 4/2016 |
| KR | 10-1692514 B1 | 1/2017 |

(Continued)

OTHER PUBLICATIONS

A-Rang Jang et al., "Wafer-Scale and Wrinkle-Free Epitaxial Growth of Single-Orientated Multilayer Hexagonal Boron Nitride on Sapphire", Nano Letters, 2016, pp. 3360-3366, vol. 16.

(Continued)

*Primary Examiner* — Selim U Ahmed
*Assistant Examiner* — Evan G Clinton
(74) *Attorney, Agent, or Firm* — Rabin & Berdo, P.C.

(57) ABSTRACT

A method for forming a hexagonal boron nitride (h-BN) thin film is provided. According to the method, an alumina thin film including amorphous alumina or gamma-alumina is prepared. An h-BN thin film is synthesized at equal to or less than 750° C. on the alumina thin film. A mono-layer thickness of the h-BN film is equal to or less than 0.40 nm.

13 Claims, 12 Drawing Sheets

120
100
130

(51) Int. Cl.
*H01L 29/16* (2006.01)
*H01L 29/24* (2006.01)

(56) References Cited

FOREIGN PATENT DOCUMENTS

| | | | |
|---|---|---|---|
| KR | 10-2017-0088037 | A | 8/2017 |
| KR | 10-1797182 | B1 | 11/2017 |

OTHER PUBLICATIONS

Ki Kang Kim et al., "Synthesis and Characterization of Hexagonal Boron Nitride Film as a Dielectric Layer for Graphene Devices", ACS NANO, 2012, pp. 8583-8590, vol. 6, No. 10.

* cited by examiner

EXAMPLE1

COMPARATIVE EXAMPLE1

700°C
600°C
500°C
N1s
Intensity (cps)
Binding Energy (eV)
EXAMPLE 1
EXAMPLE 2

METHOD FOR FORMING HEXAGONAL BORON NITRIDE THIN FILM, METHOD FOR FORMING MULTI-LAYERED STRUCTURE AND METHOD FOR MANUFACTURING SWITCHING ELEMENT USING THE SAME

CROSS-REFERENCE TO RELATED APPLICATIONS

This application claims priority under 35 U.S.C. § 119 to Korean Patent Application No. 10-2018-0134962, filed on Nov. 06, 2018, and all the benefits accruing therefrom, the content of which is herein incorporated by reference in its entirety.

BACKGROUND

1. Field

Exemplary embodiments relate to a method for forming a hexagonal boron nitride thin film. More particularly, exemplary embodiments relate to a method for forming a hexagonal boron nitride thin film, a method for forming a multi-layered structure and a method for manufacturing a switching element.

2. Description of the Related Art

Hexagonal boron nitride (h-BN) is a two-dimensional material not having surface dangling bonds. Thus, h-BN does not cause adsorbate doping to a material disposed thereon. Thus, intrinsic performance of the material disposed on h-BN may be achieved.

Furthermore, h-BN has a small lattice mismatch with graphene, and does not cause strain because of its flexibility. Thus, h-BN is an important material to achieve the intrinsic performance of graphene. Therefore, technologies capable of forming h-BN having a high quality is necessary.

SUMMARY

Exemplary embodiments provide a method for forming a hexagonal boron nitride thin film having a high quality.

Exemplary embodiments provide a method for forming a multiple-layered structure including a hexagonal boron nitride thin film.

Exemplary embodiments provide a method for manufacturing a switching element including a hexagonal boron nitride thin film.

According to an exemplary embodiment, a method for forming a hexagonal boron nitride (h-BN) thin film is provided. According to the method, an alumina thin film including amorphous alumina or gamma-alumina is prepared. An h-BN thin film is synthesized at equal to or less than 750° C. on the alumina thin film. A mono-layer thickness of the h-BN film is equal to or less than 0.40 nm.

According to an exemplary embodiment, a method for forming a stacked structure is provided. According to the method, an alumina thin film including amorphous alumina or gamma-alumina is prepared. An h-BN thin film is synthesized on the alumina thin film. A mono-layer thickness of the h-BN film is equal to or less than 0.40 nm. A graphene thin film is synthesized at an interface between the h-BN film and the alumina thin film.

According to an exemplary embodiment, a method for manufacturing a switching element is provided. According to the method, a gate electrode is formed on a substrate. An alumina thin film including amorphous alumina or gamma-alumina is formed on the gate electrode. An h-BN thin film is synthesized on the alumina thin film. A mono-layer thickness of the h-BN film is equal to or less than 0.40 nm. A channel layer including a two-dimensional active material is formed on the h-BN thin film. An electrode is formed to contact the channel layer.

According to the exemplary embodiments, an h-BN thin film having a high quality, which may not be obtained by conventional methods, may be formed at a low temperature.

Furthermore, a graphene thin film pattern and/or an h-BN thin film pattern may be formed by using a catalyst block and/or a masking block without an individual pattering process. Thus, contamination or damage of the thin films due to a patterning process such as transferring, etching or the like may be prevented, and manufacturing efficiencies may be improved.

Furthermore, combination of a gamma-alumina thin film and an h-BN thin film may provide a gate dielectric layer having superior characteristics thereby forming a switching element achieving a high performance with a low power consumption.

BRIEF DESCRIPTION OF THE DRAWINGS

The above and other features and advantages will become more apparent by describing exemplary embodiments thereof with reference to the accompanying drawings, in which.

DETAILED DESCRIPTION

Figure 1A:
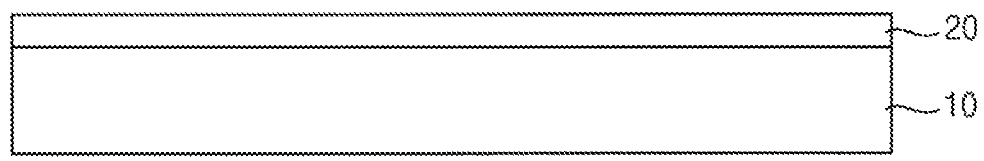
FIGS. 1A to 1B are cross-sectional views illustrating a method for forming a hexagonal boron nitride thin film according to an exemplary embodiment.

Example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity. It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method for Forming a Hexagonal Boron Nitride Thin Film

Figure 1B:
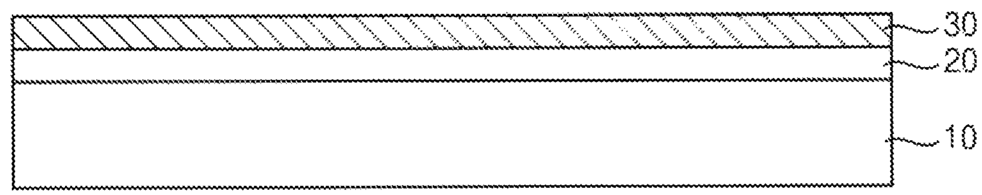

FIGS. 1A to 1B are cross-sectional views illustrating a method for forming a hexagonal boron nitride thin film according to an exemplary embodiment.

Referring to FIG. 1A, a catalyst substrate including an alumina thin film is prepared. The alumina thin film may include amorphous alumina or gamma-alumina ($\gamma$-$Al_2O_3$). In an exemplary embodiment, the catalyst substrate may include a gamma-alumina thin film 20 disposed on a base substrate 10. For example, the base substrate 10 may include silicon, silicon oxide, glass or the like.

The gamma-alumina thin film 20 may have a single-crystalline phase or a poly-crystalline phase.

Gamma-alumina has a defect spinel structure at a surface thereof. The defect spinel structure of gamma-alumina includes an aluminum tri-coordination ($Al_{III}$) site. The aluminum tri-coordination site is not stable. Thus, when a precursor such as borazine is adsorbed on a surface of gamma-alumina, the aluminum tri-coordination site reduces an activation barrier for dehydrogenation thereby functioning as a catalyst.

Furthermore, gamma-alumina may inhibit decomposition of the precursor thereby forming an h-BN thin film of a mono-layer or a bi-layer through surface limited growth.

Furthermore, gamma-alumina has a small lattice mismatch to h-BN. Thus, defects caused by a lattice mismatch or strain therefrom may be effectively inhibited. Thus, an h-BN thin film may be formed through epitaxial-like growth. Therefore, an h-BN thin film having a high quality with inhibited defects may be formed.

In an exemplary embodiment, (110) plane may be dominant at an upper surface of the gamma-alumina thin film 20. For example, (110) plane may be more than 50% at an upper surface of the gamma-alumina thin film 20. For example, sum of (110) plane and (111) plane may be equal to or more than 99%.

Furthermore, a surface of the gamma-alumina thin film 20 has a fine 3-dimensional convexo-concave structure. Such convexo-concave structure may reduce strain due to lattice mismatch. Thus, defects may be inhibited when the h-BN film is formed on the gamma-alumina thin film 20.

For example, the root mean square roughness of the gamma-alumina thin film 20 may be equal to or less than 2 nm, and may be preferably equal to or less than 0.2 nm. When the root mean square roughness of the gamma-alumina thin film 20 is excessively large, defects may be increased in the h-BN thin film formed on the gamma-alumina thin film 20.

For example, the thickness of the gamma-alumina thin film 20 may be equal to or less than 100 nm, preferably equal to or less than 50 nm and more preferably equal to or less than 10 nm. When the thickness of the gamma-alumina thin film 20 is excessively large, defects such as wrinkles may be formed in the h-BN thin film due to difference between thermal expansion efficiencies of the gamma-alumina thin film 20 and the h-BN thin film formed on the gamma-alumina thin film 20. Furthermore, less thickness may be advantageous for forming gamma phase of alumina.

In an exemplary embodiment, the gamma-alumina thin film 20 may be formed by a deposition method. For example, the gamma-alumina thin film 20 may be formed by chemical vaporization deposition (CVD) including atomic layer deposition (ALD), molecular beam epitaxy (MBE) growth or the like.

For example, an amorphous alumina thin film may be formed by ALD, and the amorphous alumina thin film may be changed to the gamma-alumina thin film 20 through a heat treatment.

For example, an aluminum precursor and an oxygen precursor may be provided in an ALD process to form the amorphous alumina thin film. For example, the aluminum precursor may include trimethyl aluminium ($(CH_3)_3Al$, TMA), aluminum isoproxide, ($[Al(OC_3H_7)_3]$, IPA), methyl-pyrolidine-tri-methyl aluminum (MPTMA), ethyl-pyridin-etriethyl-aluminum (EPPTEA) ethyl-pyridine-dimethyl-aluminumhydridge, EPPDMAH, $AlCH_3$ or a combination thereof.

For example, a crystallization process using a heat treatment may be performed at about 100° C. to 1,450° C. for 1 to 30 minutes.

The crystallization process using a heat treatment may be omitted. For example, a deposition temperature in a CVD process and an ALD process may be controlled, or an MBE growth may be performed to form a gamma-alumina thin film without an individual heat treatment process.

Referring to FIG. 1B, an h-BN thin film 30 is formed on the gamma-alumina thin film 20.

For example, the h-BN thin film 30 may be formed by deposition. For example, the h-BN thin film 30 may be formed by various deposition methods including CVD.

In an exemplary embodiment, a growth temperature of the h-BN thin film 30 may be equal to or less than about 1,200° C. Preferably, the growth temperature of the h-BN thin film 30 may be equal to or less than about 750° C. The h-BN thin film 30 having a structure of a mono-layer or bi-layer may be formed through surface limited growth at equal to or less than about 750° C.

For example, the growth temperature of the h-BN thin film 30 may be about 100° C. to 750° C. When the growth temperature is excessively low, a growth rate of the h-BN thin film 30 may be excessively reduced, or defects in h-BN thin film 30 may be increased. Furthermore, when formed on the gamma-alumina thin film 20, the h-BN thin film 30 may be synthesized at a temperature lower than when formed on an amorphous alumina thin film.

For example, borazine ($N_3B_3H_6$) may be used as a source for forming the h-BN thin film 30. Borazine may be dehydrogenated thereby forming h-BN. In another exemplary embodiment, a nitrogen source and a boron source may be separately provided. For example, borane such as $BH_3$ may be used as a boron source, and ammonia may be used as a nitrogen source. Furthermore, hydrogen gas ($H_2$) may be added for adjusting flux of the source gas or for reducing the growth temperature. An inert gas such as argon may be used as a carrier gas.

The h-BN thin film 30 may have extremely inhibited defects such as sp3 bonds, C—N bonds, B—O bonds or the like thereby having a high quality. Thus, the h-BN thin film 30 may have a small thickness close to an ideal thickness. For example, the thickness of a mono-layer in the h-BN thin film 30 may be equal or less than 0.40 nm, and the thickness of a bi-layer in the h-BN thin film 30 may be equal or less than 0.80 nm. In an exemplary embodiment, the thickness of a mono-layer in the h-BN thin film 30 may be equal or less than 0.36 nm, and the thickness of a bi-layer in the h-BN thin film 30 may be equal or less than 0.72 nm.

In an exemplary embodiment, the h-BN thin film 30 may have a thickness of a mono-layer or a bi-layer. However, exemplary embodiments are not limited thereto, and the thickness of the h-BN thin film 30 may be increased as desired. For example, the CVD process for forming the h-BN thin film 30 may be performed at more than 750° C. in order to increase the thickness of the h-BN thin film 30 to be equal to or more than a triple-layer.

In another exemplary embodiment, the h-BN thin film 30 may be formed on an amorphous alumina thin film. The amorphous alumina thin film may be crystallized by heat in the CVD process for forming the h-BN thin film 30 thereby forming the gamma-alumina thin film 20.

In another exemplary embodiment, the h-BN thin film 30 may include hexagonal boron nitride carbide (h-BNC) in which nitrogen atoms are partially replaced by carbon atoms. The h-BNC may be used for a sensor, a switching element, a light-emitting element, a tunable resistor by adjusting a band gap thereof. For example, the h-BNC may be formed by adding a carbon source to a source gas. The carbon source may include various materials such as methane, ethane, carbon dioxide or the like.

In an exemplary embodiment, the h-BN thin film 30 having a high quality, which may not be obtained by conventional methods, may be formed at a low temperature. The h-BN thin film 30 may be used for synthesis of graphene having a high quality, an electro-optical element, a doping barrier or the like.

Since the h-BN thin film 30 does not have dangling bonds at a surface thereof, an adhesion energy between the h-BN thin film 30 and the gamma-alumina thin film 20 is low. Thus, the h-BN thin film 30 may be easily separated from the gamma-alumina thin film 20 by an external force as desired. The catalyst substrate including the gamma-alumina thin film 20 may be reused for forming another h-BN thin film.

Method for Forming a Stacked Structure

Figure 2A:
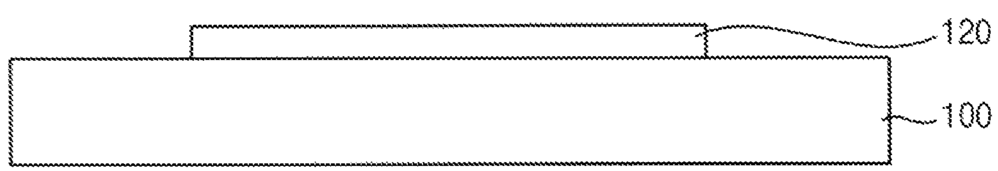
FIGS. 2A to 2C are cross-sectional views illustrating a method for forming a stacked structure of an h-BN thin film and a graphene thin film according to an exemplary embodiment.
Figure 2B:
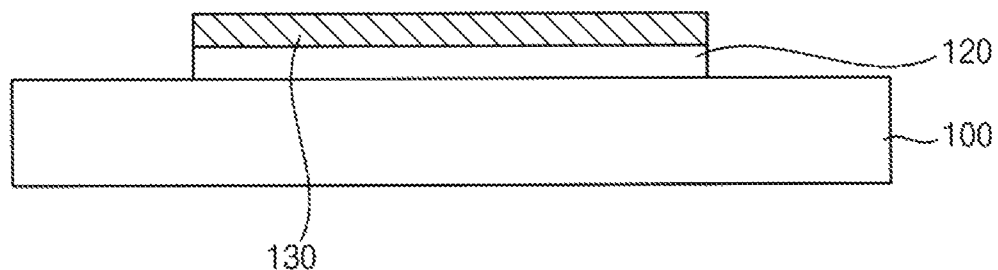
Figure 2C:
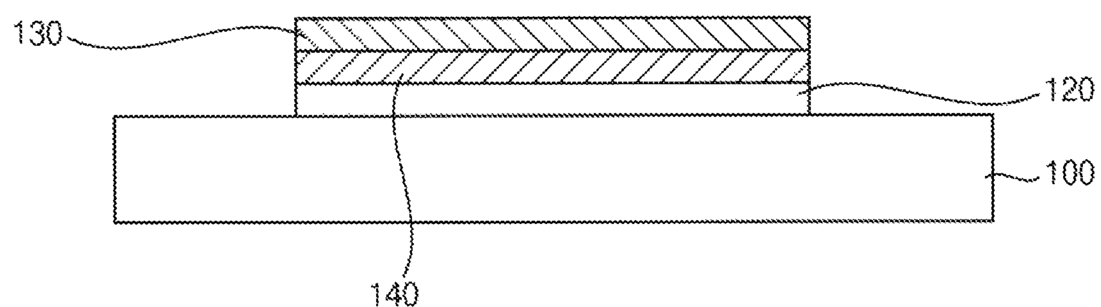

FIGS. 2A to 2C are cross-sectional views illustrating a method for forming a stacked structure of an h-BN thin film and a graphene thin film according to an exemplary embodiment.

Referring to FIG. 2A, a catalyst substrate including an alumina thin film is prepared. The alumina thin film may include amorphous alumina or gamma-alumina. In an exemplary embodiment, the alumina thin film may include gamma-alumina crystallized by heat treatment. When the alumina thin film includes amorphous alumina, the amorphous alumina may be crystallized in a following CVD process or the like thereby forming gamma-alumina.

For example, a gamma-alumina thin film 120 may be formed as a pattern on a base substrate 100. For example, the gamma-alumina thin film 120 may be patterned after or before crystallized.

Referring to FIG. 2B, an h-BN thin film 130 is formed on the gamma-alumina thin film 120. Processes for forming the h-BN thin film 130 and the gamma-alumina thin film 120 may be substantially same as the previously explained exemplary embodiment. Thus, any duplicated explanation may be omitted.

The h-BN thin film 130 may be formed according to surface limited growth using the gamma-alumina thin film 120 as a catalyst. Thus, the h-BN thin film 130 may be formed as a pattern on the gamma-alumina thin film 120.

Referring to FIG. 2*c*, a graphene thin film 130 is formed between the h-BN thin film 130 and the gamma-alumina thin film 120.

The h-BN thin film 130 does not have dangling bonds at a surface thereof. Thus, the h-BN thin film 130 is not chemically bonded to the gamma-alumina thin film 120, but is physically adhered to the gamma-alumina thin film 120 thereby forming an interface.

For example, the substrate including the stacked structure of the h-BN thin film 130 and the gamma-alumina thin film 120 may be disposed in a chamber, and a CVD process may be performed for synthesizing graphene. Hydrocarbons such as methane, ethane or the like may be provided as a carbon source for synthesizing graphene. In an exemplary embodiment, methane gas may be used for a carbon source.

The carbon source may be dehydrogenated on an exposed surface of the gamma-alumina thin film 120 by catalyst activation thereby generating source atoms such as carbon atoms. The carbon atoms generated from the carbon source may be diffused at the interface between the h-BN thin film 130 and the gamma-alumina thin film 120. Thus, the graphene thin film 140 may be synthesized between the h-BN thin film 130 and the gamma-alumina thin film 120.

For example, the graphene thin film 140 may be formed at 150° C. to 1,200° C. In an exemplary embodiment, the graphene thin film 140 may be synthesized at a relatively low temperature by catalyst activation of the gamma-alumina thin film 120. Preferably, the graphene thin film 140 may be synthesized at a lower temperature compared with other methods for synthesizing graphene, for example, at 150° C. to 800° C.

In an exemplary embodiment, synthesis of the graphene thin film 140 may be performed under a process condition including a carbon source and a growth inhibitor. Thus, an atmosphere in which the graphene thin film 140 is synthesized may include at least the carbon source and the growth inhibitor. The growth inhibitor may include an oxygen-containing material such as an oxygen gas, hydrogen oxide or the like.

Accordingly, graphene is not synthesized in an exposed area excluding the interface, because combustion reaction of the carbon atoms with the growth inhibitor or oxygen atoms from the growth inhibitor is predominant to graphitization reaction. Thus, the graphene thin film 140 is selectively formed between the h-BN thin film 130 and the gamma-alumina thin film 120 to form a graphene pattern.

For example, a concentration of the growth inhibitor, which is a volume ratio to the carbon source, may be equal to or more than $1/10^6$ so that combustion reaction may be predominant at an area excluding the interface. The concentration of the growth inhibitor, which satisfies the condition, may be varied depending on a process temperature. For example, the concentration of the growth inhibitor to the carbon source may be equal to or more than $1/10^5$ at 800° C. to 1,200° C. In an exemplary embodiment, the concentration of the growth inhibitor to the carbon source may be equal to or more than $1/10^4$ to further promote the combustion reaction in an exposed area excluding the interface. The concentration of the growth inhibitor may be a concentration of molecules, and a concentration of oxygen atoms generated from the growth inhibitor to the carbon atoms from the carbon source may be different from the concentration of molecules. For example, the concentration of the oxygen atoms to the carbon atoms may be equal to or more than $1/10^3$, may be preferably equal to or more than $1/10^2$.

A thickness of the graphene thin film 140 may be controlled. For example, the graphene thin film 140 may have a thickness of a mono-layer or a bi-layer as well as a thickness equal to or more than a triple-layer. For example, a thickness of the graphene thin film 140 may be at least 0.33 nm, and may be increased depending on a process condition.

The graphene thin film 140 may have extremely inhibited defects thereby having a high quality.

In the CVD process, impurities causing defects of graphene may enter a process chamber. When the graphene thin film 140 is formed at the interface between the h-BN thin film 130 and the gamma-alumina thin film 120 as an exemplary embodiment, affection of impurities in the process chamber may be minimized. Atoms or molecules are diffused according to interfacial diffusion between the h-BN thin film 130 and the gamma-alumina thin film 120. Diffusivity of the atoms or the molecules according to interfacial diffusion may be varied drastically depending kinds of the atoms and the molecules. For example, diffusivity according to interfacial diffusion may be calculated as the following:

$$D \approx \upsilon_0 \exp\left(\frac{-E_d}{k_B T}\right)$$

$\upsilon_0$:n-th order vibrational frequency, (mostly $10^{13}$/s)

$E_d$: interfacial diffusion barrier $k_B$: Boltzmann constant ($8.62\times10^{-5}$ eV/K)

T: absolute temperature (K)

According to the above, a ratio of diffusivities of carbon atoms and oxygen molecules is at least 20,000. Thus, affection of impurities such as oxygen molecules may be minimized in the process of synthesizing graphene. Therefore, graphene having inhibited defects may be obtained.

In an exemplary embodiment, a graphene thin film pattern may be formed without an individual pattering process. Furthermore, h-BN is a two-dimensional material having a similar structure to graphene, and may provide a template, of which lattice mismatch is minimized to graphene, for synthesizing graphene. Thus, strain and defects of the graphene thin film may be reduced and/or minimized so that the graphene thin film has a high quality.

In an exemplary embodiment, a stacked structure of an h-BN thin film and a graphene thin film may be obtained, and the stacked structure may be formed as a pattern by using a patterned catalyst thin film without an individual pattering process.

Figure 3A:
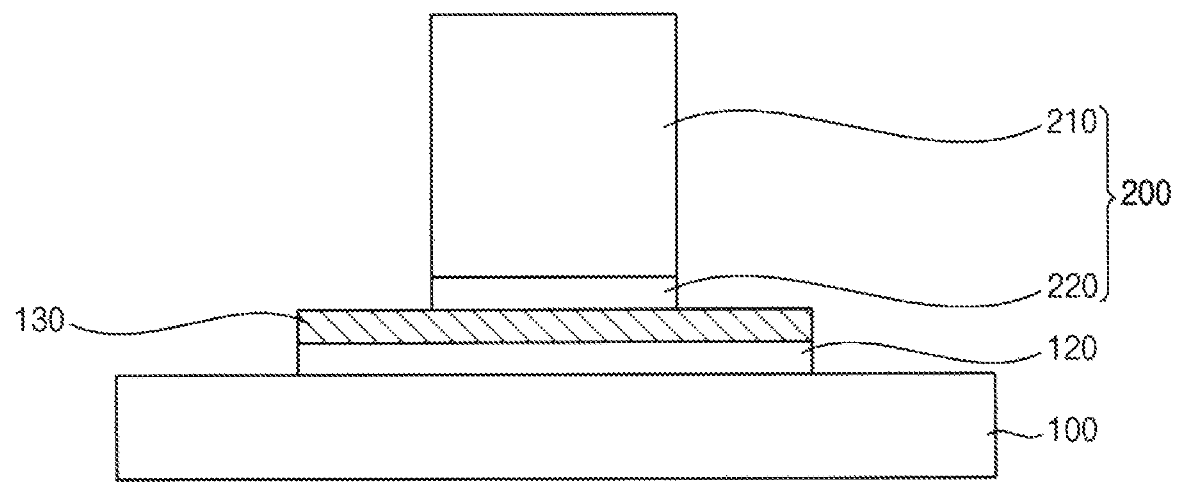
FIGS. 3A to 3C are cross-sectional views illustrating a method for forming a stacked structure of an h-BN thin film and a graphene thin film according to another exemplary embodiment.
Figure 3B:
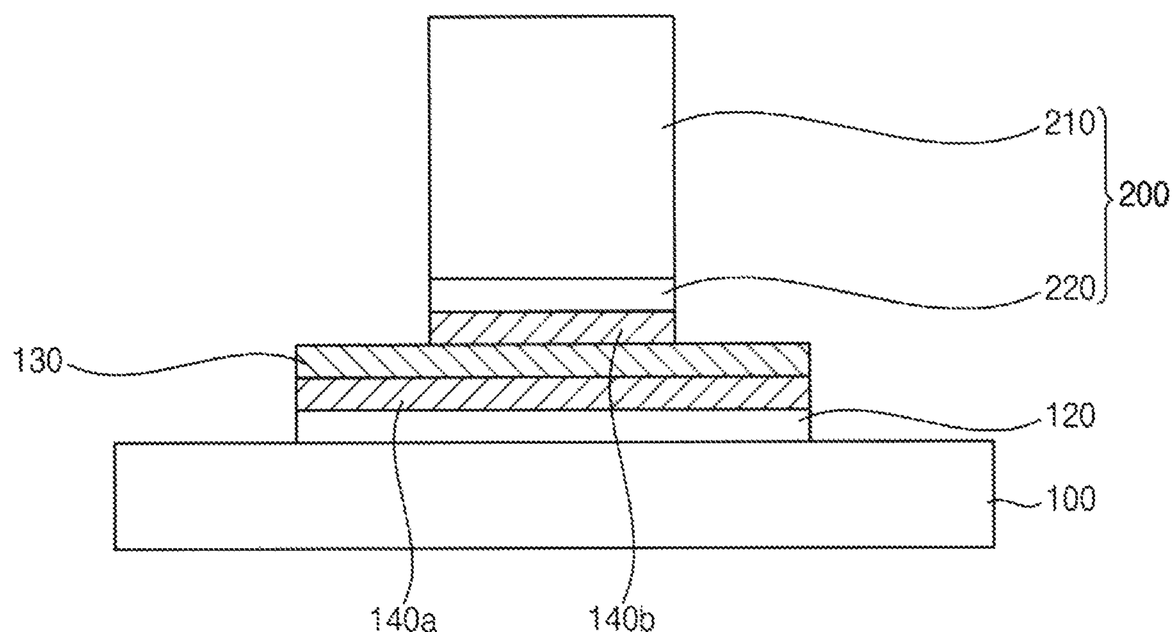
Figure 3C:
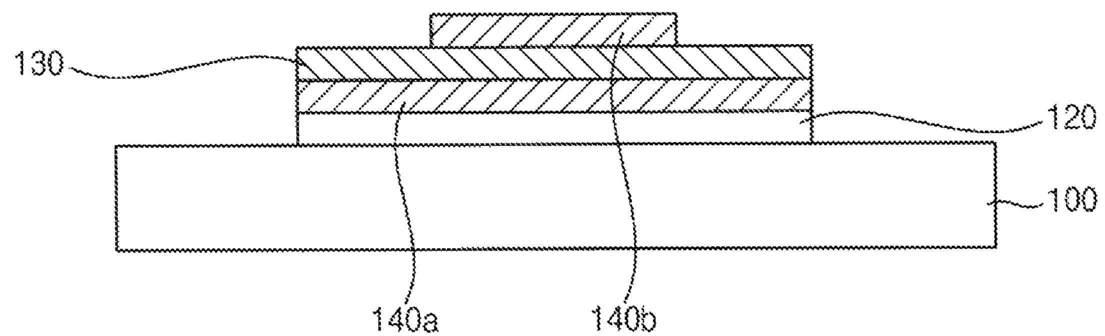

FIGS. 3A to 3C are cross-sectional views illustrating a method for forming a stacked structure of an h-BN thin film and a graphene thin film according to another exemplary embodiment.

Referring to FIG. 3A, a catalyst substrate is prepared. The catalyst substrate includes a gamma-alumina thin film 120 disposed on a base substrate 100, and an h-BN thin film 130 disposed on the gamma-alumina thin film 120. Processes for forming the h-BN thin film 130 and the gamma-alumina thin film 120 may be substantially same as the previously explained exemplary embodiment. Thus, any duplicated explanation may be omitted.

Thereafter, a catalyst block 200 is physically adhered to the h-BN thin film 130. In an exemplary embodiment, the catalyst block 200 may include a body 210 and a catalyst layer 220 covering a surface of the body 210. The catalyst layer 220 may cover at least a lower surface of the body 210, and may contact an upper surface of the h-BN thin film 130. For example, the body 210 may include silicon, silicon oxide, metals, metal oxides or a combination thereof.

In another exemplary embodiment, the catalyst layer 220 may further cover a side surface of the body 210 to increase a contact area with a carbon source.

The catalyst block 200 may function as a catalyst to form a graphene thin film on the upper surface of the h-BN thin film 130. Furthermore, the catalyst block 200 is physically adhered to the upper surface of the h-BN thin film 130 thereby forming an interfacial diffusion barrier for a growth inhibitor between the catalyst block 200 and the h-BN thin film 130. For example, a distance between the catalyst block 200 and the h-BN thin film 130 may be equal to or less than 2 nm.

In order to physically adhere the catalyst block 200 to the h-BN thin film 130, a contact surface of the catalyst block 200 may be cleaned.

For example, cleaning the contact surface of the catalyst block 200 may include steps of chemical cleaning, physical cleaning and drying.

In an exemplary embodiment, Piranha solution may be used for the chemical cleaning. The Piranha solution may be obtained by mixing sulfuric acid with hydrogen peroxide. For example, the contact surface of the catalyst block 200 may be dipped in the Piranha solution for the chemical cleaning.

In an exemplary embodiment, supersonic wave and water may be used for the physical cleaning. For example, a process such as Megasonic cleaning may be used for generating an acoustic field thereby removing particles on the contact surface of the catalyst block 200.

In an exemplary embodiment, nitrogen gas or the like may be provided for drying.

Furthermore, a contact surface of the h-BN thin film 130 may be cleaned by same processes as the above.

After the cleaning process, the catalyst block 200 and the h-BN thin film 130 are disposed to contact each other such that the contact surface of the catalyst block 200 is parallel with an upper surface of the h-BN thin film 130. Accordingly, the catalyst block 200 is physically adhered to the h-BN thin film 130 thereby forming the interfacial diffusion barrier to the growth inhibitor between the catalyst block 200 and the h-BN thin film 130.

Referring to FIG. 3B, a lower graphene thin film 140*a* is formed between the h-BN thin film 130 and the gamma-alumina thin film 120, and an upper graphene thin film 140*b* is formed between the h-BN thin film 130 and the catalyst block 200.

For example, graphene thin films may be formed through a CVD process. The graphene thin films may be synthesized in an atmosphere including a carbon source and a growth inhibitor.

As previously explained in the above, a carbon source such as methane may be dehydrogenated by the gamma-alumina thin film 120 and the catalyst block 200 to provide carbon atoms. The carbon atoms may be diffused at an interface between the h-BN thin film 130 and the gamma-alumina thin film 120 and at an interface between the h-BN thin film 130 and the catalyst block 200. Furthermore, diffusion of the growth inhibitor at the interfaces is extremely inhibited. Furthermore, graphene is not synthesized in an exposed area excluding the interfaces because of combustion reaction of the carbon atoms and the growth inhibitor. Thus, the graphene thin films may be selectively formed between the h-BN thin film 130 and the gamma-alumina thin film 120 and between the h-BN thin film 130 and the catalyst block 200.

Referring to FIG. 3C, the catalyst block 200 is separated from the upper graphene thin film 140*b*. An adhesion energy between the upper graphene thin film 140*b* and the h-BN thin film 130 is larger than an adhesion energy between the upper graphene thin film 140*b* and the catalyst layer 220 including gamma-alumina. Thus, when an external force is applied to the catalyst block 200, the catalyst block 200 may be easily separated from the upper graphene thin film 140*b*.

Generally, it may be difficult to separate members that are physically adhered to each other through chemical and physical cleaning. However, according to an exemplary embodiment, the upper graphene thin film 140*b* is formed between the h-BN thin film 130 and the catalyst block 200, and an adhesion energy between the upper graphene thin film 140*b* and the catalyst layer 220 including gamma-alumina is relatively low. Thus, the catalyst block 200 may be easily separated. The catalyst bock 200 may be reused for another process for synthesizing graphene.

According to an exemplary embodiment, graphene thin films may be formed on both surfaces of the h-BN thin film through a single deposition process. A stacked structure of graphene thin film/h-BN thin film/graphene thin film may be used for various elements including a capacitor. Furthermore, the stacked structure may have various shapes by using the catalyst block.

FIGS. 4A to 4E are cross-sectional views illustrating a method for forming a stacked structure of an h-BN thin film and a graphene thin film according to another exemplary embodiment.

Figure 4A:
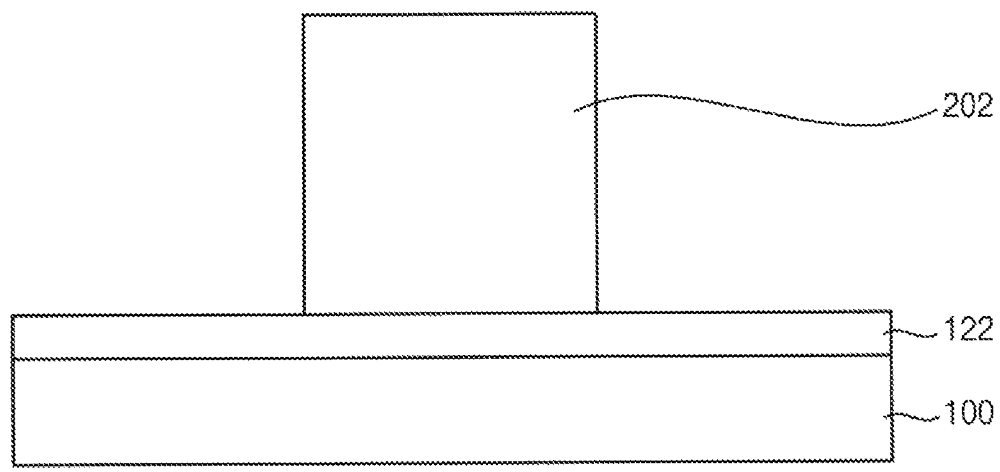
FIGS. 4A to 4E are cross-sectional views illustrating a method for forming a stacked structure of an h-BN thin film and a graphene thin film according to another exemplary embodiment.

Referring to FIG. 4A, a catalyst substrate is prepared. The catalyst substrate includes an alumina thin film disposed on a base substrate 100. In an exemplary embodiment, the alumina thin film may be a gamma-alumina thin film 122. When the alumina thin film includes amorphous alumina, the alumina thin film may be changed into a gamma-alumina thin film in the process of forming an h-BN thin film.

Thereafter, a masking block 202 is physically adhered to the gamma-alumina thin film 122. The masking block 202 may cover a portion of an upper surface of the gamma-alumina thin film 122. Thus, the upper surface of the gamma-alumina thin film 122 is partially exposed.

In an exemplary embodiment, the masking block 202 may include a catalyst material such as gamma-alumina. However, exemplary embodiments are not limited thereto, and the masking block 202 may not include a catalyst material in another exemplary embodiment.

Figure 4B:
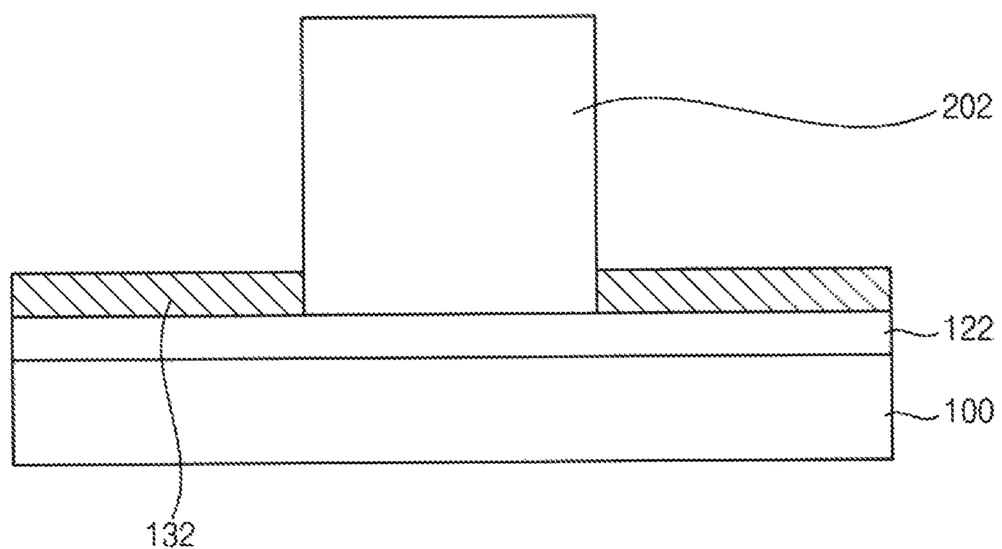

Referring to FIG. 4B, an h-BN thin film 132 is formed on an exposed upper surface of the gamma-alumina thin film 122. For example, the h-BN thin film 132 may be formed through a CVD process.

As previously explained in the above, borazine may be used as a source gas for forming the h-BN thin film 132. The gamma-alumina thin film 122 is physically adhered to the masking block 202 thereby forming a diffusion barrier for the source gas. Thus, the source gas is not provided between the gamma-alumina thin film 122 and the masking block 202. Thus, the h-BN thin film 132 is selectively formed on the exposed upper surface of the gamma-alumina thin film 122.

Figure 4C:
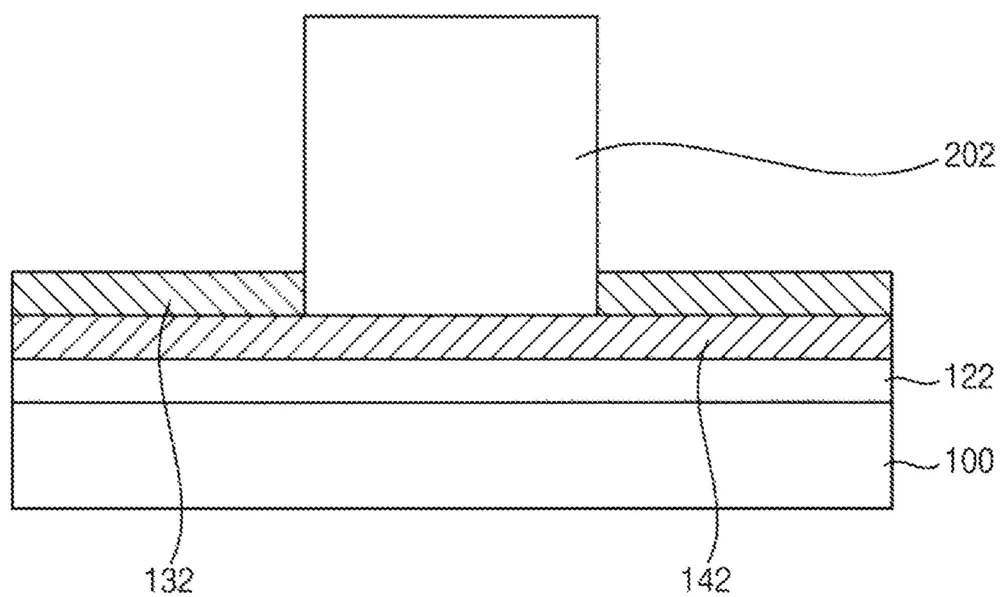

Referring to FIG. 4C, a graphene thin film 142 is formed between the gamma-alumina thin film 122 and the masking block 202 and between the gamma-alumina thin film 122 and the h-BN thin film 132.

The graphene thin film 142 may be synthesized in an atmosphere including a carbon source and a growth inhibitor.

The carbon atoms generated from the carbon source may be diffused at an interface between the h-BN thin film 132 and the gamma-alumina thin film 122 and at an interface between the masking block 202 and the gamma-alumina thin film 122. Furthermore, diffusion of the growth inhibitor at the interfaces is extremely inhibited. Furthermore, graphene is not synthesized in an exposed area excluding the interfaces because of combustion reaction of the carbon atoms and the growth inhibitor. Thus, the graphene thin film 142 having a high quality may be selectively formed at the interfaces.

Figure 4D:
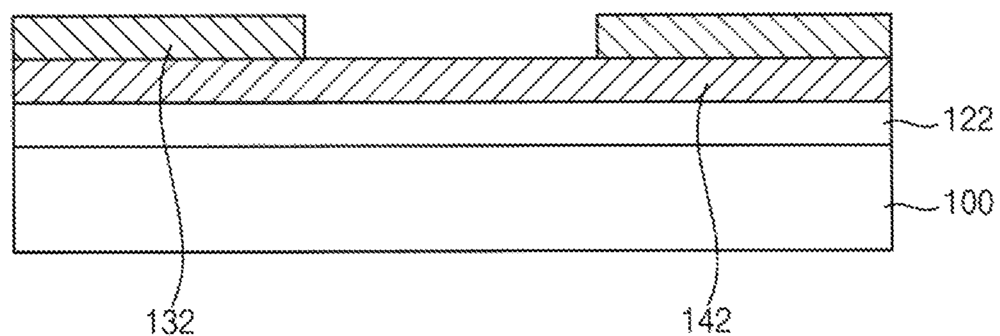

Referring to FIG. 4D, the masking block 202 is removed from the graphene thin film 142. Thus, the h-BN thin film 132 may be formed as a pattern having an opening or a gap, which correspond to a contact surface of the masking block 202.

Accordingly, the patterned h-BN thin film 132 may be formed on the graphene thin film 142 without an individual patterning process.

Figure 4E:
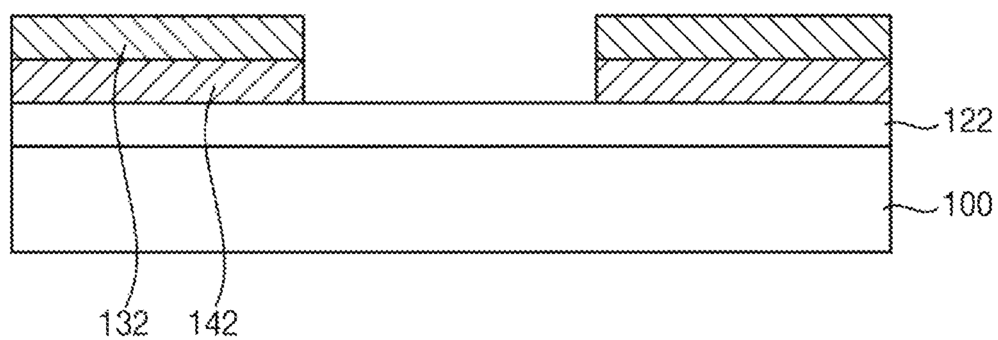

In another exemplary embodiment, the masking block 202 may be removed before the graphene thin film 142 is formed. When graphene is synthesized without the masking block 202, a graphene thin film 142 is formed between the h-BN thin film 132 and the gamma-alumina thin film 122 without covering an exposed surface of the gamma-alumina thin film 122. Thus, as illustrated in FIG. 4E, stacked structures of h-BN/graphene, which are spaced apart from each other, may be formed.

Method for manufacturing a switching element

FIGS. 5A to 5E are cross-sectional views illustrating a method for manufacturing a switching element according to an exemplary embodiment.

Figure 5A:
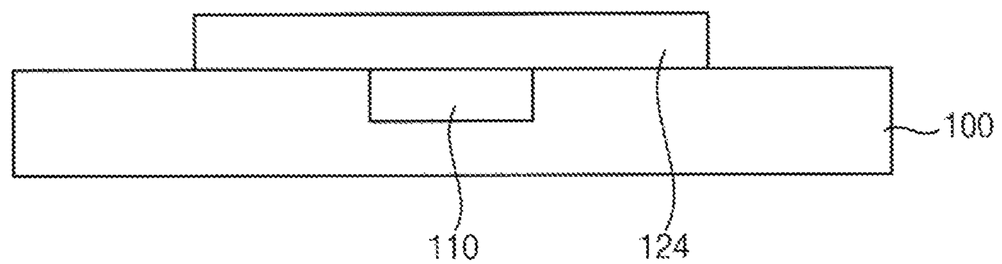
FIGS. 5A to 5E are cross-sectional views illustrating a method for manufacturing a switching element according to an exemplary embodiment.

Referring to FIG. 5A, an alumina thin film is formed on a base substrate 100 including a gate electrode 110 formed thereon. In an exemplary embodiment, the alumina thin film may include gamma-alumina crystallized through a heat treatment. When the alumina thin film include amorphous alumina, the amorphous alumina may be crystallized in a following CVD process or the like thereby forming gamma-alumina.

In an exemplary embodiment, the base substrate 100 may have a trench recessed from an upper surface of the base substrate 100, and the gate electrode 110 may be disposed in the trench. However, exemplary embodiments are not limited thereto. For example, the gate electrode 110 may be formed on a flat upper surface of the base substrate 100 to have an exposed side surface, and a gamma-alumina thin film 124 may be formed to be conformal on an upper surface and a side surface of the gate electrode 110 and on the upper surface of the base substrate 100.

For example, the gate electrode 110 may include a metal. For example, the gate electrode 110 may include titanium, aluminum, tungsten, copper, molybdenum, gold, silver, nickel, an alloy thereof, a conductive nitride thereof or the like.

In an exemplary embodiment, the gamma-alumina thin film 124 is formed on the gate electrode 110. The gamma-alumina thin film 124 may be formed as a pattern covering an upper surface of the gate electrode 120 and a portion of an upper surface of the base substrate 100.

Figure 5B:
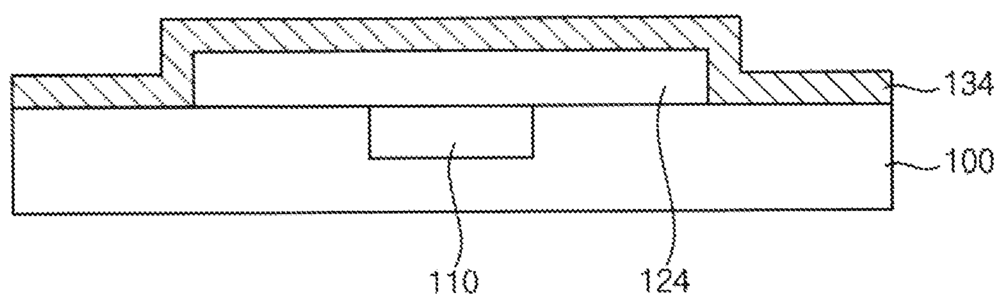

Referring to FIG. 5B, an h-BN thin film 134 is formed on the gamma-alumina thin film 124. In an exemplary embodiment, the h-BN thin film 134 may continuously cover an upper surface and a side surface of the gamma-alumina thin film 124 and an exposed upper surface of the base substrate 100.

In an exemplary embodiment, the h-BN thin film 134 may be formed on the upper surface of the gamma-alumina thin film 124 through surface limited growth by a catalyst at a low temperature to have a structure of a mono-layer or a bi-layer. Thereafter, the h-BN thin film 134 may further grow at a high temperature to cover the side surface of the gamma-alumina thin film 124 and the exposed upper surface of the base substrate 100.

In another exemplary embodiment, the h-BN thin film 134 may continuously grow at a high temperature.

Figure 5C:
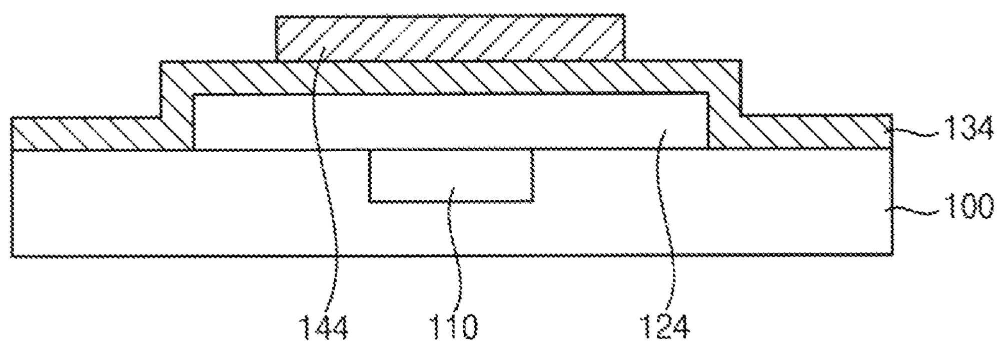

Referring to FIG. 5C, a channel layer 144 is formed on the h-BN thin film 134. At least a portion of the channel layer 144 may overlap the gate electrode 110.

For example, the channel layer 144 may include a two-dimensional active material. For example, the two-dimensional active material may include graphene, a transitional metal dichalcogenide or the like. For example, the transitional metal dichalcogenide may include molybdenum sulfide, molybdenum selenide, tungsten sulfide, tungsten selenide, titanium selenide or the like.

In an exemplary embodiment, the channel layer 144 may be formed as a pattern partially covering an upper surface of the h-BN thin film 134, or as a continuous layer entirely covering the upper surface of the h-BN thin film 134.

Figure 5D:
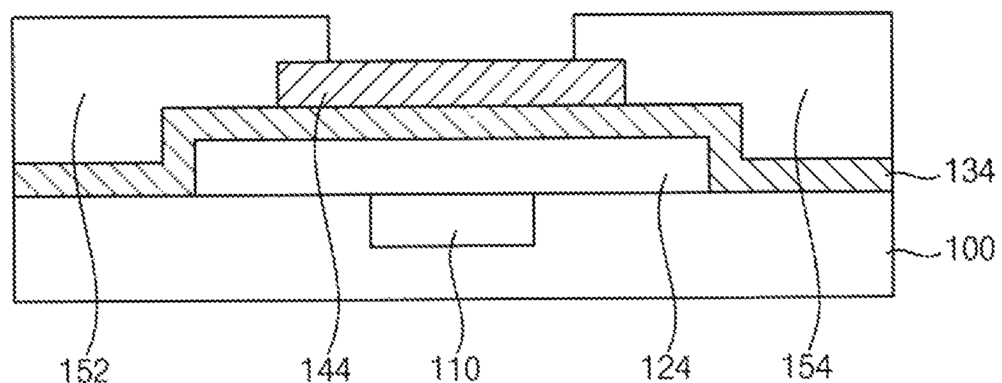

Referring to FIG. 5D, a first electrode 152 and a second electrode 154 are formed to contact the channel layer 144. The first electrode 152 and the second electrode 154 may be spaced apart from each other, and may function as a source electrode and a drain electrode, respectively. The first electrode 152 and the second electrode 154 may be formed of various conductive materials including metals.

Figure 5E:
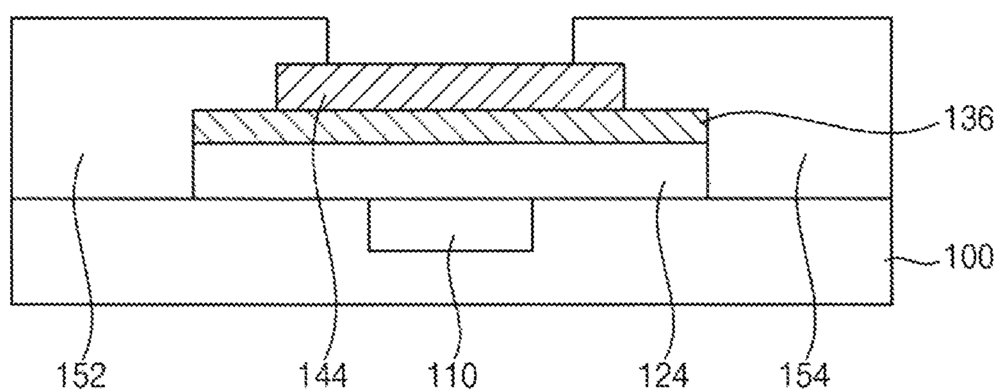

In an exemplary embodiment, the h-BN thin film 134 may continuously cover the upper surface of the gamma-alumina thin film 124 and the upper surface of the base substrate 100. However, exemplary embodiments are not limited thereto. For example, an h-BN thin film 134 may be formed selectively on the gamma-alumina thin film 124 as illustrated in FIG. 5E.

According to an exemplary embodiment, a combination of the gamma-alumina thin film 124 and the h-BN thin film 134 is provided for a gate dielectric layer of a switching element. The combination may provide advantages as the gate dielectric layer. For example, since the h-BN thin film 134 does not have dangling bonds, doping of an active material contacting the h-BN thin film 134 may be prevented. Furthermore, since gamma-alumina has a high permittivity, the combination may provide a gate dielectric layer having superior dielectric properties and surface properties.

Furthermore, if defects exist in the h-BN thin film 134, the defects may form dipole when an electric field is applied thereto. Thus, transmitting the electric field may be hindered, and an h-BN thin film having many defects may be easily broke down. However, according to an exemplary embodiment, defects in the h-BN thin film 134 may be inhibited. Thus, break-down by an electric field may be prevented. Therefore, a total thickness of the gate dielectric layer may be reduced. Furthermore, since a strong electric field may be formed by a small voltage, a switching element may be driven by lower power consumption.

Furthermore, since the h-BN thin film 134 includes a two-dimensional insulation material and has few defects, the two-dimensional active material formed thereon may have a high quality.

A thickness of the gamma-alumina thin film 124 and the h-BN thin film 134 may be designed according to desired permittivity or the like.

For example, the thickness of the gamma-alumina thin film 124 may be equal to or less than 100 nm. When the thickness of the gamma-alumina thin film 124 is excessively large, the quality of the h-BN thin film 134 may be deteriorated by wrinkle. When the thickness of the gamma-alumina thin film 124 is excessively small, permittivity may be reduced. For example, the thickness of the h-BN thin film 134 may be equal to or more than 2 nm, and preferably 2 nm to 20 nm so that the combination of the gamma-alumina thin film 124 and the h-BN thin film 134 may have appropriate characteristic as the gate dielectric layer.

Hereinafter, effects of exemplary embodiments will be explained with reference to particular examples and experiments

Experiment 1—Evaluation of Catalyst Characteristics of Gamma-Alumina

Synthetic Example 1—Forming Amorphous Alumina Thin Film

An alumina ($Al_2O_3$) thin film was formed on a base substrate at 150° C. in an atomic layer deposition (ALD) reactor. The base substrate included $SiO_2$/Si having a thickness of 300 nm. Trimethylaluminum and deionized water were used for a precursor of an ALD process. A pressure was 1 ton, and pulse-maintaining time was 1 second with providing high-purity nitrogen gas (99.99%) for 60 seconds with 200 sccm in the ALD reactor. Under the above condition, 500 cycles were performed to form an amorphous alumina thin film having a thickness of 50 nm.

Synthetic Example 2—Forming Gamma-Alumina Thin Film

The amorphous alumina thin film of Synthetic Example 1 was disposed on a reaction furnace and heat-treated at 1,050° C. for 30 minutes with vacuum condition to form a gamma-alumina thin film.

Example 1—CVD for Forming h-BN Thin Film

With maintaining a temperature of borazine canister as 10° C., under 2 atm, with providing 20 sccm of Ar/borazine mixture gas and 1,000 sccm of hydrogen gas by MFC, a source gas was guided to the reaction furnace, on which the amorphous alumina thin film of Synthetic Example 1 was disposed. The above was performed at 1,050° C., 850° C., 700° C., 600° C. and 500° C., respectively.

Example 2—CVD for Forming h-BN Thin Film

Under the same condition as Example 1, a source gas was guided to a reaction furnace, on which the gamma-alumina thin film of Synthetic Example 2 was disposed. The above was performed at 700° C., 600° C. and 500° C., respectively.

Comparative Example 1—CVD for Forming h-BN Thin Film

Under the same condition as Example 1, a source gas was guided to a reaction furnace, on which an $SiO_2$/Si substrate having a thickness of 300 nm was disposed. The above was performed at 1,050° C., 850° C., 700° C., 600° C. and 500° C., respectively.

Figure 6:
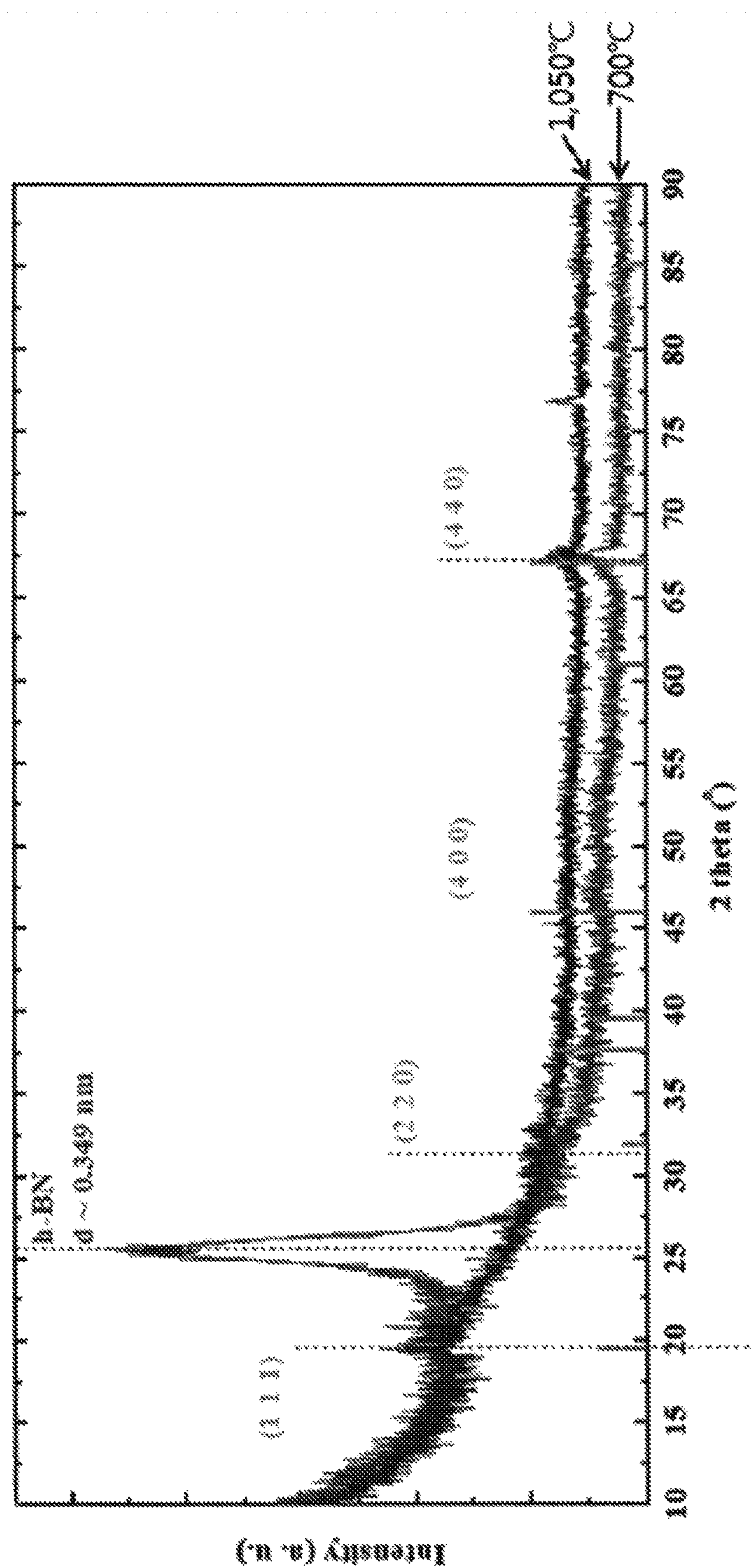
FIG. 6 is an XRD analysis graph of the thin films obtained by Example 1.
Figure 7A:
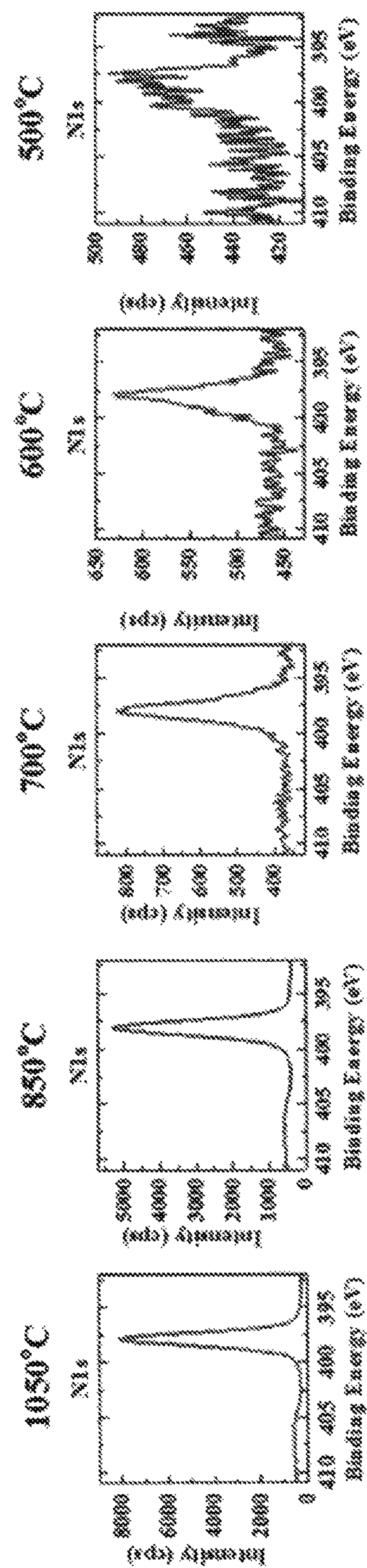
FIG. 7A are XPS analysis graphs of the thin films obtained by Example 1 and Comparative Example 1.
Figure 7A:
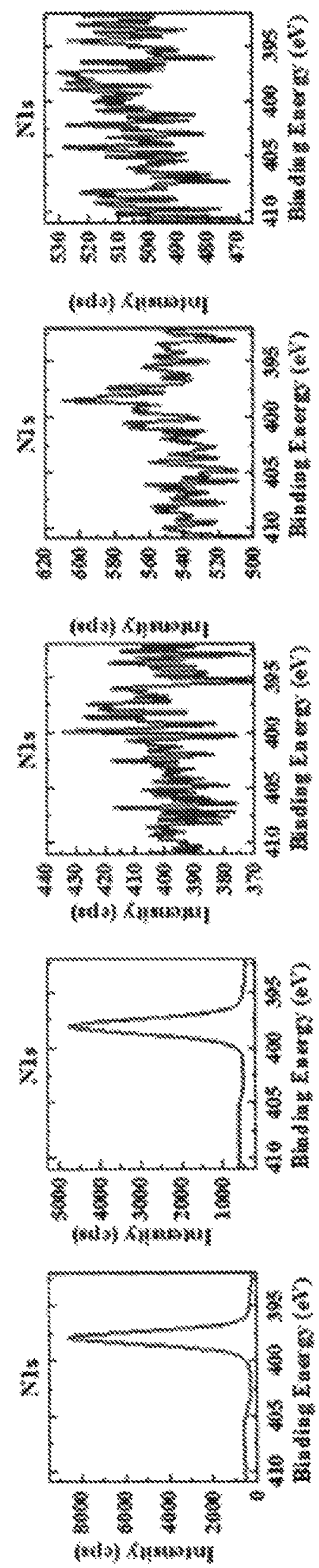
Figure 7B:
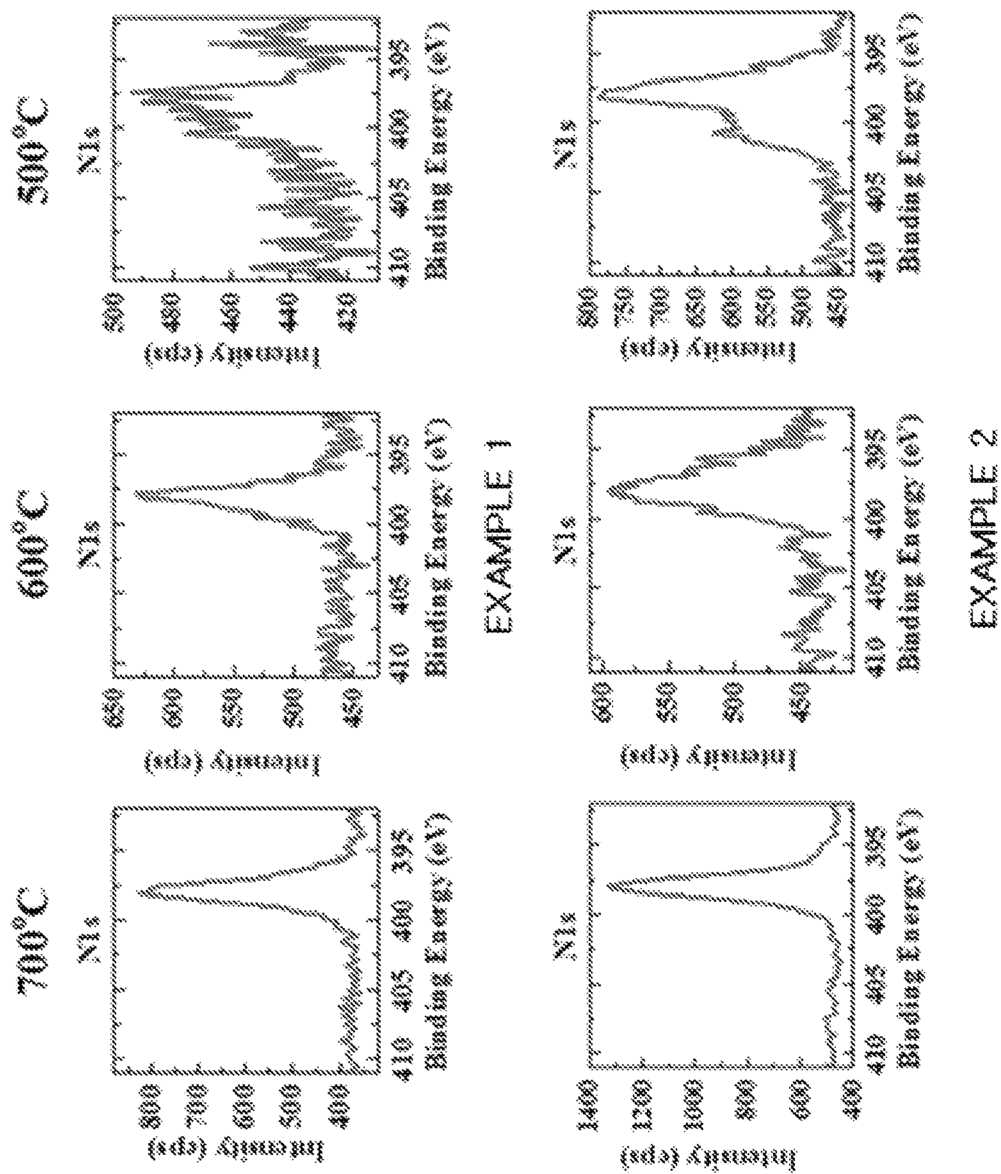
FIG. 7B are XPS analysis graphs of the thin films obtained by Example 1 and Example 2.

FIG. 6 is an XRD analysis graph of the thin films obtained by Example 1. FIG. 7A are XPS analysis graphs of the thin films obtained by Example 1 and Comparative Example 1. FIG. 7B are XPS analysis graphs of the thin films obtained by Example 1 and Example 2.

Referring to FIG. 6, (110), (220), (400) and (440) peaks have endemic positions of gamma-alumina, which do not overlap other crystal phase. Thus, it can be noted that the amorphous alumina thin film was changed to the gamma-alumina thin film. Especially, (440) and (400) peaks are crystal directions due to a defect spinel structure of gamma-alumina, which may be proof of aluminum tri-coordination ($Al_{III}$) site.

Referring to FIG. 6, a peak corresponding to h-BN appears at 1,050° C., and does not appear at 700° C. However, referring to FIG. 7A, sp2 peak of N1s corresponding to h-BN appears with single Gaussian shape at 700° C. When considering that XRD cannot analyze a thickness less than a tri-layer, it can be noted that an h-BN film having a thickness equal to or less than a bi-layer was formed at 700° C.

Referring to FIG. 7A, sp2 peak of N1s appears with single Gaussian shape at 600° C. in Example 1. Thus, an h-BN film having a high quality was formed in Example 1.

However, when the $SiO_2$/Si substrate was used as Comparative Example 1, a peak of B1s as well as sp2 peak of N1s does not appear at equal to or less than 700° C.

Thus, it can be noted that gamma-alumina formed from amorphous alumina through crystallization by heat may function as a catalyst for synthesizing h-BN and that an-h-BN thin film having a high quality may be formed at a low temperature.

Referring to FIG. 7B, when the h-BN thin film was formed on the gamma-alumina thin film as Example 2, sp2 peak of Nis appears at 500° C. Thus, it can be noted that synthesizing h-BN on a gamma-alumina thin film may reduce a process temperature than synthesizing h-BN on an amorphous alumina thin film.

Exemplary embodiments of the present invention may be used for forming an insulation layer, a dielectric layer, a doping barrier for various elements, and for manufacturing various electronic elements including an electro-optical modulator, a switching element, a transistor, optical device or the like.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure.

What is claimed is:

1. A method for forming a hexagonal boron nitride (h-BN) thin film, the method comprising:
- preparing an alumina thin film including amorphous alumina or gamma-alumina; and
- synthesizing an h-BN thin film at equal to or less than 750° C. on the alumina thin film, wherein a mono-layer thickness of the h-BN film is equal to or less than 0.40 nm.

2. The method of claim 1, wherein amorphous alumina in the alumina thin film is crystallized and changed to gamma-alumina when the h-BN thin film is synthesized.

3. The method of claim 1, wherein the alumina thin film includes gamma-alumina, and has a thickness equal to or less than 100 nm, wherein (110) plane is more than 50% at an upper surface of the alumina thin film, and a root mean square roughness of the alumina thin film is equal to or less than 0.2 nm.

4. The method of claim 1, further comprising:
- physically adhering a masking block to a portion of an upper surface of the gamma-alumina thin film before the h-BN thin film is synthesized, wherein the h-BN thin film is selectively formed on an exposed upper surface of the gamma-alumina thin film.

5. The method of claim 1, wherein nitrogen atoms in the h-BN thin film are partially replaced by carbon atoms.

6. A method for forming a stacked structure, the method comprising:
- preparing an alumina thin film including amorphous alumina or gamma-alumina;
- synthesizing an h-BN thin film on the alumina thin film, wherein a mono-layer thickness of the h-BN film is equal to or less than 0.40 nm; and
- synthesizing a graphene thin film at an interface between the h-BN film and the alumina thin film.

7. The method of claim 6, wherein the alumina thin film includes gamma-alumina, and has a thickness equal to or less than 100 nm, wherein (110) plane is more than 50% at an upper surface of the alumina thin film, and a root mean square roughness of the alumina thin film is equal to or less than 0.2 nm.

8. The method of claim 6, wherein the graphene thin film is synthesized at equal to or less than 800° C., wherein a process gas provided for synthesizing the graphene thin film includes hydrocarbon gas.

9. The method of claim 8, wherein the process gas further includes an oxygen-containing gas as a growth inhibitor.

10. The method of claim 6, further comprising:
- physically adhering a catalyst block including a catalyst material to an upper surface of the h-BN thin film before the graphene thin film is synthesized, wherein the graphene thin film includes a lower graphene thin film synthesized at the interface between the h-BN film and the alumina thin film, and un upper graphene thin film synthesized at the interface between the h-BN film and the catalyst block.

11. A method for manufacturing a switching element, the method comprising:
- forming a gate electrode on a substrate;
- forming an alumina thin film including amorphous alumina or gamma-alumina on the gate electrode;

synthesizing an h-BN thin film on the alumina thin film, wherein a mono-layer thickness of the h-BN film is equal to or less than 0.40 nm;

forming a channel layer including a two-dimensional active material on the h-BN thin film; and forming an electrode contacting the channel layer.

12. The method of claim 11, wherein the channel layer include graphene or transitional metal dichalcogenide.

13. The method of claim 11, wherein the thickness of the alumina thin film is equal to or less than 100 nm, and the thickness of the h-BN thin film is equal to or more than 2 nm.

* * * * *